(12) United States Patent
Cook

(10) Patent No.: US 11,705,301 B2
(45) Date of Patent: Jul. 18, 2023

(54) CHARGED PARTICLE BEAM MANIPULATION DEVICE AND METHOD FOR MANIPULATING CHARGED PARTICLE BEAMLETS

(71) Applicant: ICT Integrated Circuit Testing Gesellschaft für Halbleiterprüftechnik mbH, Heimstetten (DE)

(72) Inventor: Benjamin John Cook, Munich (DE)

(73) Assignee: ICT Integrated Circuit Testing Gesellschaft für Halbleiterprüftechnik mbH, Heimstetten (DE)

( * ) Notice: Subject to any disclaimer, the term of this patent is extended or adjusted under 35 U.S.C. 154(b) by 0 days.

(21) Appl. No.: 17/152,480

(22) Filed: Jan. 19, 2021

(65) Prior Publication Data
US 2022/0230836 A1    Jul. 21, 2022

(51) Int. Cl.
  *H01J 37/14*    (2006.01)
  *H01J 37/145*   (2006.01)
  *H01J 37/147*   (2006.01)
  *H01J 37/317*   (2006.01)

(52) U.S. Cl.
CPC ........ *H01J 37/145* (2013.01); *H01J 37/1471* (2013.01); *H01J 37/3174* (2013.01); *H01J 2237/0453* (2013.01); *H01J 2237/141* (2013.01); *H01J 2237/1516* (2013.01)

(58) Field of Classification Search
CPC .. H01J 37/145; H01J 37/1471; H01J 37/3174; H01J 37/10; H01J 2237/0453; H01J 2237/141; H01J 2237/1516
USPC .................................................... 250/396 R
See application file for complete search history.

(56) References Cited

U.S. PATENT DOCUMENTS

| 6,614,026 | B1 * | 9/2003 | Adamec | H01J 37/1478 |
| | | | | 250/398 |
| 7,928,403 | B2 * | 4/2011 | Adamec | H01J 37/12 |
| | | | | 250/311 |
| 8,242,467 | B2 | 8/2012 | Jager et al. | |
| 8,445,862 | B2 * | 5/2013 | Chen | H01J 37/141 |
| | | | | 250/396 ML |
| 8,785,880 | B2 * | 7/2014 | Sawada | H01J 37/153 |
| | | | | 250/396 R |
| 8,866,102 | B2 * | 10/2014 | Frosien | H01J 37/1471 |
| | | | | 250/306 |
| 9,437,395 | B2 * | 9/2016 | Li | H01J 37/265 |
| 9,922,799 | B2 * | 3/2018 | Li | H01J 37/28 |

(Continued)

OTHER PUBLICATIONS

Joy, David C. "The aberration-corrected SEM." Biological Low-Voltage Scanning Electron Microscopy. Springer, New York, NY, 2008. 107-127. (Year: 2008).*

*Primary Examiner* — Wyatt A Stoffa
(74) *Attorney, Agent, or Firm* — Kilpatrick Townsend & Stockton LLP

(57) ABSTRACT

It is provided a charged particle beam manipulation device for a plurality of charged particle beamlets, the charged particle beam manipulation device including a lens having a main optical axis, the lens including at least a first array of multipoles, each multipole of the first array of multipoles configured to compensate for a lens deflection force on a respective charged particle beamlet of the plurality of charged particle beamlets, the lens deflection force being a deflection force produced by the lens on the respective charged particle beamlet towards the main optical axis of the lens.

15 Claims, 3 Drawing Sheets

(56) References Cited

U.S. PATENT DOCUMENTS

| | | | | |
|---|---|---|---|---|
| 10,347,460 B2* | 7/2019 | Zhao | | H01J 37/1475 |
| 10,453,645 B2* | 10/2019 | Frosien | | H01J 37/153 |
| 10,832,886 B2* | 11/2020 | Ikegami | | H01J 37/153 |
| 10,978,270 B2* | 4/2021 | Winkler | | H01J 37/20 |
| 11,081,313 B2* | 8/2021 | Uhlemann | | H01J 37/153 |
| 2012/0145917 A1* | 6/2012 | Chen | | H01J 37/28 |
| | | | | 250/398 |
| 2015/0060662 A1* | 3/2015 | Chen | | H01J 37/141 |
| | | | | 250/307 |
| 2016/0064180 A1* | 3/2016 | Ren | | H01J 37/1475 |
| | | | | 250/307 |
| 2018/0254167 A1* | 9/2018 | Zhao | | H01J 37/222 |
| 2018/0350555 A1* | 12/2018 | Li | | H01J 37/28 |
| 2019/0013176 A1* | 1/2019 | Breuer | | H01J 37/10 |
| 2019/0019649 A1* | 1/2019 | Winkler | | H01J 37/147 |
| 2019/0035595 A1* | 1/2019 | Ren | | H01J 37/28 |
| 2020/0027689 A1* | 1/2020 | Breuer | | H01J 37/153 |
| 2020/0234912 A1* | 7/2020 | Liu | | H01J 37/1474 |
| 2022/0005667 A1* | 1/2022 | Tamaki | | H01J 37/153 |

* cited by examiner

CHARGED PARTICLE BEAM MANIPULATION DEVICE AND METHOD FOR MANIPULATING CHARGED PARTICLE BEAMLETS

FIELD

Aspects of the present disclosure relate to multi-beam systems and to manipulating charged particle beamlets. Further aspects of the disclosure relate to a charged particle beam manipulation device and a method for manipulating charged particle beams.

BACKGROUND

Charged particle beam apparatuses have many functions in a plurality of industrial fields, including inspection of semiconductor devices during manufacturing, exposure systems for lithography, detecting devices and testing systems. Therefore, there is great demand for structuring and inspecting specimens at the micrometer and nanometer scale.

Micrometer and nanometer scale process control, inspection or structuring, is often done with charged particle beams, e.g. electron beams, which are generated and focused in charged particle beam devices, such as electron microscopes or electron beam pattern generators. Charged particle beams offer superior spatial resolution compared to photon beams due to their shorter wavelengths.

A high throughput during imaging, particularly inspection of samples, such as semiconductor wafers, is beneficial to further enhance the capability of charged particle beam devices for industrial manufacturing. For example, faster inspection during semiconductor manufacturing enables more wafers or larger areas of a wafer to be inspected for even better control of the manufacturing process.

Multi-beam systems can provide more beams thus provide faster imaging and inspection. However, there is still a continuous demand for ever faster systems.

SUMMARY

In view of the above, a charged particle beam manipulation device and a method for manipulating charged particle beamlets are provided.

According to an aspect, a charged particle beam manipulation device for a plurality of charged particle beamlets is provided. The charged particle beam manipulation device includes a lens having a main optical axis, the lens including at least a first array of multipoles, each multipole of the first array of multipoles configured to compensate for a lens deflection force on a respective charged particle beamlet of the plurality of charged particle beamlets, the lens deflection force being a deflection force produced by the lens on the respective charged particle beamlet towards the main optical axis of the lens.

According to a further aspect, a charged particle beam manipulation device for a plurality of charged particle beamlets is provided. The charged particle beam manipulation device includes a lens having a coil surrounding a main optical axis, the coil having an opening for the charged particle beamlets, the lens including a first array of multipoles; each multipole of the first array of multipoles configured to compensate for a lens deflection force on a respective charged particle beamlet of the plurality of charged particle beamlets, the lens deflection force being a deflection force produced by the lens on the respective charged particle beamlet towards the main optical axis of the lens.

According to a further aspect, a method for manipulating charged particle beamlets, the method includes influencing, using a lens having a main optical axis, the charged particle beamlets, and compensating, using a respective multipole of a first array of multipoles included within the lens, for a lens deflection force on a respective charged particle beamlet of the plurality of charged particle beamlets, the lens deflection force being a deflection force produced by the lens on the respective charged particle beamlet towards the main optical axis of the lens.

Thus, according to aspects of the invention, at least one common cross-over of beamlets associated with beamlets passing through a common lens can be avoided. Accordingly, electron-electron interactions from said cross-over of beamlets can be avoided. Thus, multi-beam performance can be improved, in particular, throughput can be improved. In this manner, limitation from electron-electron interactions, particularly for single source single column multi-beam systems with common lens can be reduced or avoided altogether.

Further aspects, advantages and features of the present disclosure are apparent from the description and the accompanying drawings.

BRIEF DESCRIPTION OF THE FIGURES

So that the manner in which the above recited features of the present disclosure can be understood in more detail, a more particular description of the disclosure, briefly summarized above, may be had by reference to the accompanying drawings which are briefly described as follows.

DETAILED DESCRIPTION

Reference will now be made in detail to the various embodiments, one or more examples of which are illustrated in each figure. Each example is provided by way of explanation and is not meant as a limitation. For example, features illustrated or described as part of one embodiment can be used on or in conjunction with any other embodiment to yield yet a further embodiment. It is intended that the present disclosure includes such modifications and variations.

Within the following description of the drawings, the same reference numbers refer to the same or to similar components. Generally, only the differences with respect to the individual embodiments are described. Unless specified otherwise, the description of a part or aspect in one embodiment applies to a corresponding part or aspect in another embodiment as well.

The reference numbers used in the figures are merely for illustration. The aspects described herein are not limited to any particular embodiment. Instead, any aspect, embodiments and implementations described herein can be combined with any other aspect(s), implementation(s) or embodiment(s) described herein unless specified otherwise.

Figure 1:
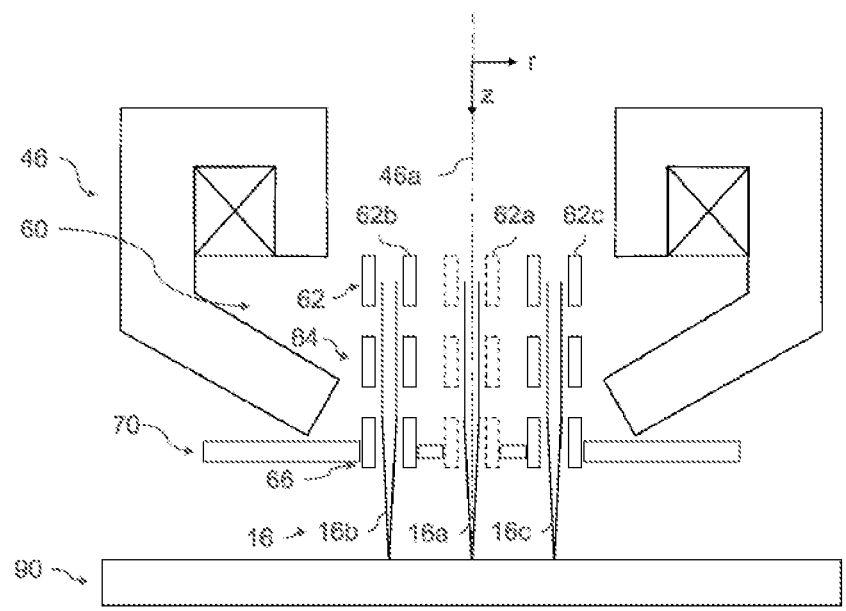
FIG. 1 is a schematic drawing illustrating a charged particle beam manipulation device according to embodiments described herein.

FIG. 1 shows a charged particle beam manipulation device according to embodiments described herein. According to embodiments, the charged particle beam manipulation device is suitable for a plurality of charged particle beamlets, e.g. suitable for a multi-beam type system.

The charged particle beam manipulation device may be provided with at least one lens, e.g. one lens, two lens, three lens or more. The lens provided may include at least one of an objective lens 46 a condenser lens 42, a beam-splitter lens and a global (shared) lens having an array of micro-lenses.

In some embodiments, the lens is configured to focus charged particle beamlets 16 e.g. onto respective positions on a specimen 90. In some embodiments, the lens is configured to collimate charged particle beamlets 16.

In some embodiments, the lens has a main optical axis. For example, an objective lens 46 may have a main optical axis of the objective lens 46a. In another example, a condenser lens 42 may have a main optical axis of the condenser lens 42a.

The lens includes at least a first array of multipoles 62. Each multipole of the first array of multipoles 62 may be configured to compensate for a lens deflection force on the respective charged particle beamlet 16. A lens deflection force to be compensated is a deflection force, by the lens, on a charged particle beamlet towards the main optical axis of the lens. A charged particle beamlet 16 may be deflected by the lens when the charged particle beamlet 16 is off-axis relative to the main optical axis of the lens.

According to embodiments, the lens may have a first array of multipoles. The lens may have a coil surrounding a main optical axis. The coil may have an opening, for example a single opening, for the charged particle beamlets 16.

Each multipole of the first array of multipoles 62 may be configured to provide a multipole deflection force to the respective charged particle beamlet 16 to cause the respective charged particle beamlet 16 to propagate essentially parallel to or along a respective optical axis of the respective multipole of the first array of multipoles 62.

Accordingly, the charged particle beamlets 16 may be focused by the lens without being deflected by the lens. Alternatively, the charged particle beamlets 16 may be focused by the lens but with any deflection by the lens fully compensated or partially compensated (e.g. reduced), for example by a multipole as described herein.

A common lens can provide an advantage of more beamlets per unit area, as compared to having separate lens for each beamlet. Accordingly, having a common lens would allow many beamlets for a given area. A common lens may be understood as having the meaning of being shared by a plurality of charged particle beamlets. That is, a common lens is a lens for a plurality of charged particle beamlets.

However, a common lens in a multi-beam system would affect (e.g. focus, deflect) each beamlet 16 differently, according to the angle and position at which the beamlet enters the lens.

A multi-beam system using a common lens and having an array or arrays of multipoles 60 according to embodiments of the present disclosure can provide a lens where lens effects such as deflection of beamlets 16 entering off-axis to the main optical axis of the lens can be compensated (e.g. deflection of the beamlets 16 relative to each other is zero), reduced (e.g. deflection of the beamlets 16 relative to each other is reduced), or uniformized (e.g. deflection of beamlets 16 relative to each other are uniform or equal), while other effects such as focusing or condensing of the beamlets 16 is preserved or produced.

A charged particle device according to the following embodiments, which may be combined with each other, having a lens according to embodiments of the present disclosure is beneficial.

In an embodiment, the charged particle device may have only one charged particle source 10. In another embodiment, the charged particle device may be a single source device.

In a further embodiment, the charged particle device may be a single column device.

In an example, a single column charged particle device having only one charged particle source 10 having a lens according to embodiments of the present disclosure is beneficial. One benefit is the usable area of the common (shared) lens is extended. Accordingly, throughput is improved.

According to embodiments, the lens may be configured for, and operated such that no crossovers or a reduced number of crossovers is generated from a charged particle source 10 to the specimen 90. Accordingly, throughput is improved.

Figure 3:
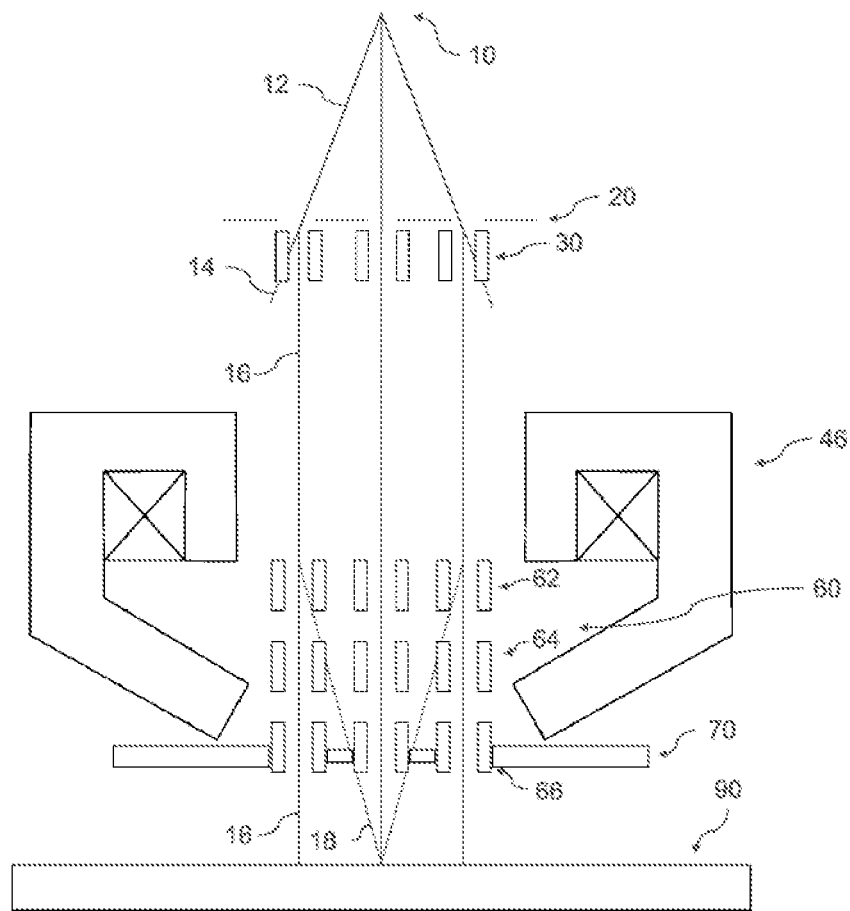
FIG. 3 is a schematic drawing illustrating a charged particle beam device having two charged particle beam manipulation devices according to embodiments described herein.

The charged particle beam manipulation device may be arranged to have an essentially telecentric beam path. An example is shown in FIG. 3.

Thus, a lens having a lens that includes an array of multipoles according to embodiments of the present disclosure can compensate for lens deflections forces on respective charged particle beamlets.

In this way, benefits include at least one of reduced/avoided beam crossovers, electron-electron interactions and their negative effects minimised, and throughput improved.

Furthermore, a multi-beam system having a common lens, rather than separate lenses such as a separate lenslet for each beamlet, can ease manufacturing and assembly requirements.

The terms lens and common lens as used herein may be used interchangeably.

According to embodiments, a first charged particle beamlet 16a may be an on-axis beamlet. A second charged particle beamlet 16b and third charged particle beamlet 16c may be off-axis beamlets. A charged particle source 10 may be a charged particle emitter or an electron gun.

FIG. 1 shows an example with a first charged particle beamlet 16a, second charged particle beamlet 16b and third charged particle beamlet 16c. The first charged particle beamlet 16a propagates along a main optical axis of the lens. The second charged particle beamlet 16b and third charged particle beamlet 16c may travel at a distance to the main optical axis of the lens.

In some embodiments, the second charged particle beamlet 16b and third charged particle beamlet 16c may travel parallel to the main optical axis as shown in FIG. 3.

Figure 2:
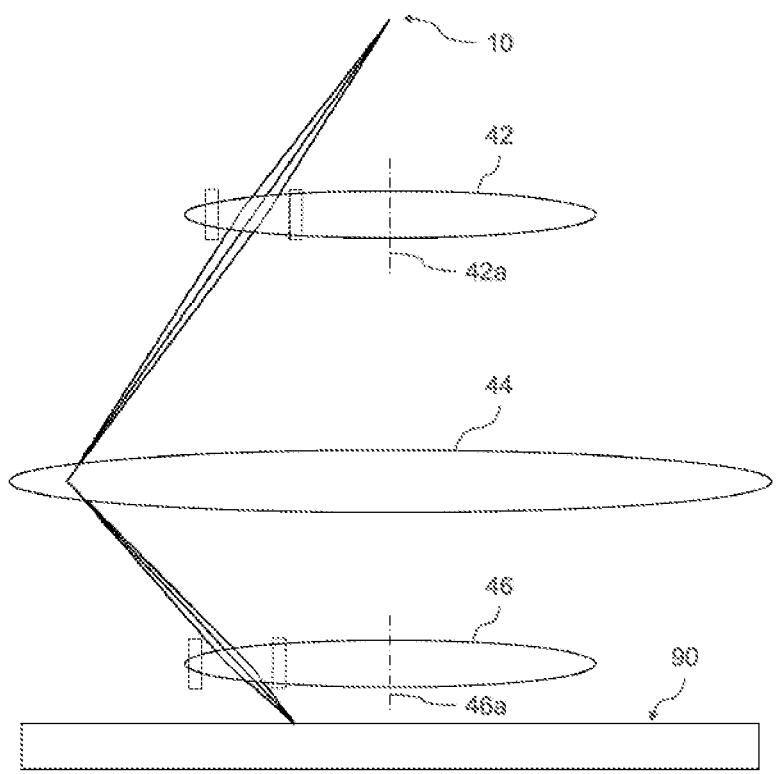
FIG. 2 is a schematic drawing illustrating a charged particle beam device having a charged particle beam manipulation device according to embodiments described herein.

In some embodiments, the second charged particle beamlet 16b and third charged particle beamlet 16c may travel at an angle to the main optical axis of the lens as shown in FIG. 2.

In the example shown in FIG. 1, the lens is an objective lens 46 and the main optical axis is the main optical axis of the objective lens 46a.

In another example, the lens may be a condenser lens 42 (FIG. 2) and the main optical axis is the main optical axis of the condenser lens 42a.

The embodiments provided herein may be combined. For example, a charged particle beam manipulation device may have a condenser lens according to embodiments of a lens described herein, an objective lens according to embodiments of a lens described herein, other common (shared) lens(es) according to embodiments of a lens described herein, or any combination, such as both objective lens and condenser lens.

An embodiment of a charged particle beam manipulation device having a condenser lens 42 and an objective lens 46 according to embodiments of a lens described herein is shown in FIG. 2.

Such a lens has the advantage that usable area of the lens, e.g. condenser lens 42, objective lens 46, is increased, thus improving throughput, i.e. more beamlets or a higher density of beamlets can be provided.

A field lens 44, as shown in FIG. 2 may be provided. The field lens 44 may be arranged between a condenser lens 42 and an objective lens 46. The field lens may be a positive-powered lens.

The condenser lens 42 and the objective lens 46 may be according to embodiments or examples of a lens or common lens as described herein.

A condenser lens 42 may influence the charged particle beamlets, e.g. focus, without collecting or converging the charged particle beamlets. Thus, a field lens arranged downstream from a condenser lens 42 may advantageously collect or converge charged particle beamlets from the condenser lens 42.

In some embodiments, a condenser lens may be provided without array(s) of multipoles according to embodiments described herein. Accordingly, a field lens may be provided to (further) converge or collect the charged particle beamlets.

The charged particle beamlets 16 may be emitted from a charged particle source 10 which is shown in FIG. 2 and FIG. 3.

While the first charged particle beamlet 16a may travel on-axis or along the main optical axis of the lens, for example along the main optical axis of the objective lens 46a as shown in FIG. 1 and FIG. 3, further charged particle beamlets, such as the second charged particle beamlet 16b and the third charged particle beamlet 16c may travel off-axis with respect to the main optical axis of the lens.

FIG. 1 and FIG. 3 show charged particle beamlets travelling off-axis and parallel to the main optical axis of the objective lens 46a. FIG. 2 shows charged particle beamlet travelling off-axis and at an angle to the main optical axis of the condenser lens 42a and to the main optical axis of the objective lens 46a.

A charged particle beamlet may be deflected according to the deflection field of the lens. FIG. 3 shows off-axis charged particle beamlets 18 (in dotted line) that may be deflected towards the main optical axis of the objective lens 46a, in the case where array(s) of multipoles 60, e.g. first array of multipoles 62, second array of multipoles 64, and third array of multipoles 66 are absent.

According to embodiments, the lens, such as the objective lens 46, may be a magnetic lens or a combined electrostatic-magnetic lens. For example, the objective lens 46 includes overlapping magnetic and electrostatic lens fields. Accordingly, charged particle beamlets may be accelerated to reduce or avoid electron-electron interactions.

A deceleration field can be provided to decelerate the charged particle beamlets immediately before the sample. Accordingly, the desired landing energy (on the specimen) of the charged particle beamlets can be provided. Accordingly, the combined electrostatic magnetic lens can provide a superior resolution of a charged particle beam device.

An off-axis lens, such as an off-axis lens field or off-axis action in combination with a dipole, such as a dipole field or dipole action can substitute for an on-axis lens, such as an on-axis lens field or on-axis action. According to embodiments, off-axis may be understood as the respective axes being unaligned. For example, an off-axis lens may be understood as the (main) optical axis of the lens is unaligned with respect to the charged particle beam or charged particle beamlet propagating through said lens or vice versa.

A further higher order pole field, such as an n-pole field or n-pole action can additionally compensate for higher order terms (aberrations) such as coma and/or astigmatism. The dipole or higher order pole field can be generated by electrostatic, magnetic or electrostatic-magnetic elements, such as electrodes, coils.

A compensating dipole field may compensate deflection field of an (off-axis) objective lens field to provide an (pseudo) on-axis field or on-axis action. Accordingly, multipoles such as micro-multipoles, may compensate for the deflection effect of the lens on off-axis beamlet(s) by providing an equal or substantially equal magnitude of deflection in the opposite direction of the deflection effect of the lens on off-axis beamlet(s).

In some embodiments, a first array of multipoles 62 having one multipole for each charged particle beamlet is thus provided.

By compensating for a lens deflection force and/or correcting for aberrations, the usable area of the lens is extended and throughput is improved. By compensating for a lens deflection force, resolution can be improved since for example beam cross-overs can be minimised or avoided.

As an example, (axial) astigmatism may be corrected by a quadrupole, e.g. stigmator. In another example, three-fold astigmatism may be corrected by a hexapole, e.g. hexapole stigmator. In a further example, four-fold astigmatism may be corrected by an octopole, e.g. octopole stigmator.

According to some embodiments, a multipole may be arranged coincident with a respective charged particle beamlet propagation path. Beneficially, a multipole may be oriented parallel to a respective charged particle beamlet propagation path axis. Accordingly, a lens deflection force may be compensated.

In some embodiments, a multipole may be arranged off-axis with respect to a respective charged particle beamlet propagation path axis. Beneficially, a multipole may be arranged at a distance from a respective charged particle beamlet propagation path axis. Beneficially, a multipole may be arranged at a distance from a respective charged particle beamlet propagation path axis and oriented parallel to said respective charged particle beamlet propagation path axis.

An offset distance may be less than the multipole gap length or bore size. Beneficially, a multipole may be offset with respect to a respective charged particle beamlet propagation path axis for causing a negative aberration to at least partially compensate or at least partially correct for an aberration of the lens.

The first array of multipoles 62 may be arranged proximate to or within the lens (e.g. objective lens 46) as shown in FIG. 1. Objective lens 46 as shown in FIG. 1 has main optical axis of the objective lens 46a.

Multipoles may be provided within a common lens such as a condenser lens 42 as shown in FIG. 2. Condenser lens 42 as shown in FIG. 2 has main optical axis of the condenser lens 42a.

The first array of multipoles 62 (and possibly a second array of multipoles 64 and a third array of multipoles 66) can be provided within an opening of a (magnetic) pole piece of the lens 46 and/or within the central gap of the lens 46.

The first array of multipoles 62 may be proximate and/or upstream of the objective lens (not shown in FIG. 1), for example immediately upstream of the objective lens.

A plurality of arrays of multipoles 60 may be provided. The arrays of multipoles may be arranged or distributed along the main optical axis of the lens or along the z-axis as shown in FIG. 1. The arrays of multipoles 60 may be arranged both proximate to and within the lens. Alternatively, all of the array(s) of multipoles may be arranged within the lens.

Having more than one array of multipoles 60 enables the compensation of the lens deflection force on charged particle beamlets (on off-axis charged particle beamlets) to be shared. Thereby the size and requirements of each multipole is reduced enabling larger density of beamlets and improved throughput.

For example, each multipole may provide a dipole proportional to the deflection of the lens or according to the deflection field strength of the lens at the axial position of the respective multipole, or as a function of axial distance or distance in the direction of the main optical axis of the lens. Accordingly, the lens deflection force on a respective charged particle beamlet may be compensated using a respective multipole.

Each multipole of an array of multipoles 60 may be configured to generate a multipole deflection force on the respective charged particle beamlet to cause the respective charged particle beamlet to propagate essentially parallel to a first direction for compensating for the lens deflection force. The first direction may be the respective charged particle beamlet propagation direction as the respective charged particle beamlet enters a deflection field of the lens. Accordingly, lens effects such as deflection of beamlets entering off-axis to the main optical axis of the lens can be compensated, reduced or uniformized, while other effects such as focusing or condensing can be preserved or allowed. The usable area of the lens may thus be extended, and throughput improved.

Alternatively, each multipole of an array of multipoles 60 may be configured to provide a multipole deflection field having a field strength proportional to a distance for causing the respective charged particle beamlet to propagate essentially parallel to a first direction. The second distance may be a distance between a respective multipole and the main optical axis of the lens. Accordingly, each multipole may be implemented with less complexity for extending a usable area of the common lens, for improving throughput.

An axial distance or axial position may be understood as a distance or position along a main optical axis of the lens or along the z-axis (FIG. 1). An axis perpendicular to the main optical axis of the objective lens may be referred to as a radial axis or r-axis (FIG. 1).

Having more than one array of multipoles 60 reduces the amount of multipole deflection force to be provided by each multipole or each array of multipole. Accordingly, requirement for each multipole is eased. For example, the required magnitude of dipole moment may be eased. Accordingly, the array of multipoles can be optimised to increase throughput. For example, density of beamlets can be increased or pitch of the beamlets or distance between adjacent beamlets can be reduced, for increased throughput.

Having an array of multipoles proximate to the lens, rather than within the lens, for example, upstream of the lens, can reduce the number of arrays of multipoles to be arranged within the lens. This provides an advantage when space within the lens is limited. Such an array or arrays of multipoles proximate to a lens may pre-compensate for the lens deflection force on beamlets, the lens deflection force produced by the lens. The lens deflection force may be towards a main optical axis of the lens. Alternatively, or in addition, such an array or arrays of multipoles proximate to a lens may pre-correct for an aberration of the lens.

A plurality of arrays of multipoles may be arranged uniformly spaced along the main optical axis or along the z-direction. Alternatively, a plurality of arrays of multipoles may be arranged according to the field strength of the lens. For example, a plurality of arrays of multipoles may be arranged such that the number of arrays is proportional to the rate of change of field strength of the lens.

For example, at least a first array of multipoles and a second array of multipoles may be arranged within the lens. The second array of multipoles may be downstream of the first array of multipoles. The centre of the first array of multipoles and second array of multipoles may coincide with the peak field strength of the lens.

A third array of multipoles may be provided upstream of the first array of multipoles. Alternatively, or in addition, a fourth array of multipoles may be arranged downstream of the second array of multipoles.

A first distance between the first array of multipoles and second array of multipoles may be less than a second distance between the first array of multipoles and a third array of multipoles. A first distance between the first array of multipoles and second array of multipoles may be less than a third distance between the second array of multipoles and a fourth array of multipoles. Accordingly, a plurality of arrays of multipoles may be arranged according to the field strength of the lens.

The first distance, second distance, and third distance may be proportional to the rate of change of field strength of the lens. Accordingly, a plurality of arrays of multipoles may be arranged such that the number of arrays is proportional to the rate of change of field strength of the lens.

According to embodiments, the first array of multipoles 62 within the lens can operate by providing direct or local compensation at the at least first array of multipoles 62, beneficially by providing local compensation at the position of the array and possibly in an area or region up to a subsequent array of multipoles.

According to some embodiments, two or more arrays of multipoles can be provided. For example, a charged particle manipulation device can include a first array of multipoles 62, a second array of multipoles 64 and third array of multipoles 66.

For two or more arrays of multipoles, each array of multipoles within the lens can operate by providing direct or local compensation at position of the respective array of multipoles, particularly local compensation at the position of the array and possibly in an area or region up to a subsequent array of multipoles.

Each multipole of the first array of multipoles is configured to compensate for a lens deflection force on a respective charged particle beamlet of the plurality of charged particle beamlets 16. The lens deflection force on the respective charged particle beamlet may be towards the main optical axis of the lens. The lens deflection force on a respective charged particle beamlet may be produced by the lens.

The field strength of the lens for a multipole to compensate may be the field strength of the lens at the position of said multipole.

Each multipole of an array of multipoles 60 within a lens may provide a field having a field strength proportional to a distance between said multipole and the main optical axis 52 of the lens for deflecting a respective charged particle beamlet 16. Each multipole of an array of multipoles 60 may be configured to generate a multipole deflection force on a respective charged particle beamlet 16 to cause the respective charged particle beamlet 16 to propagate essentially parallel to a respective optical axis of the respective multipole of the first array of multipoles 62.

Accordingly, the usable area of a lens, such as an objective lens 46 or a condenser lens 42, can be increased.

According to some embodiments, which can be combined with other embodiments described herein, a multipole of an array of multipoles 60, for example the second multipole 62b, may compensate for a lens deflection force on an off-axis beamlet, for example the second charged particle beamlet 16b, by the lens by 'moving' the axis of the lens to the respective off-axis beamlet propagation axis.

For example, the multipole provides a multipole deflection field, e.g. an electric field, in addition to the magnetic field and/or electric field of the lens, to generate a combined deflection field that is locally, substantially symmetric about the axis of the respective further charged particle beamlet(s), such as the second charged particle beamlet 16b and the third charged particle beamlet 16c.

Accordingly, a multipole compensating an off-axis charged particle beamlet such as the second charged particle beamlet 16b and third charged particle beamlet 16c, that is propagating at a distance to the main optical axis of the lens, for example parallel to the main optical axis, may compensate and/or modify the field of the lens so that the lens appears to be a lens that is shifted to an axis that is parallel to the actual main optical axis of the lens.

For example, the lens may be virtually shifted to be coincident with the propagation axis of the respective off-axis beamlet, such as the second charged particle beamlet 16b and third charged particle beamlet 16c. At least one array of multipoles 60, for example a first array of multipoles 62, may be arranged within the lens, and may be described as an in-lens array of multipoles.

There may also be an array of multipoles, for example third array of multipoles 66, arranged downstream of the lens, or within the lens at the downstream end of the lens, or even both i.e. at least one array of multipoles arranged within the lens and at least one array of multipoles arranged proximate to the lens, e.g. directly upstream or downstream of the lens.

The concepts of proximate to and within the lens may be according to the definition of the extent of the lens. Therefore, the extent of the lens may be according to the physical extent, e.g. according to a coordinate system, e.g. z-, and r-extent of the lens.

Alternatively, the extent of the lens may be the effective extent of the magnetic and/or electric field of the lens. For example, an effective extent of the field of the lens may be the extent to which a charged particle beam may be expected to operate in and the lens may be expected to exert a force on a charged particle beam or beamlet.

For example, at the downstream side of the lens, where the lens is an objective lens 46, a specimen 90, for example on a specimen stage, may be arranged, such that the extent of the objective lens 46 may be defined to extend up to the specimen 90 or the specimen stage.

Alternatively, the extent of the lens may be defined according to the extent in which the field of the lens is the dominant force on a charged particle in that extent.

A specimen 90 and/or specimen stage may be arranged downstream of an objective lens 46. For example, a specimen 90 and/or specimen stage may be arranged directly downstream of the objective lens 46. The objective lens 46 may be an immersion objective lens. That is, a specimen 90 or specimen stage may be arranged within the field of the objective lens 46. The objective lens 46 may be an immersion lens configured to work with a specimen 90 or specimen stage within the field of the objective lens.

As shown in FIG. 1, a proxi-electrode 70 may be arranged between the specimen 90 or the specimen stage and the objective lens 46. The proxi-electrode 70 may be configured to provide an extraction field. The proxi-electrode may be an additional electrode. The objective lens 46 may include the proxi-electrode 70.

The proxi-electrode 70 may include a plurality of openings. There may be one opening in the proxi-electrode for each beamlet 16. The number of openings in the proxi-electrode 70 may correspond to the number of beamlets. Alternatively, the number of openings in the proxi-electrode 70 may correspond to the number of multipoles in the at least one array of multipoles 60.

A potential of the proxi-electrode 70 may be substantially equal with a potential of the plurality of charged particle beamlets 16.

A potential of the proxi-electrode 70 may be substantially equal with a potential of at least one of a first array of multipoles 62, a second array of multipoles 64, and a third array of multipoles 66. In an example, a potential of the proxi-electrode 70 may be substantially equal with a potential at a centre of each aperture of the respective array potential of at least one of the first array of multipoles 62, the second array of multipoles 64, and the third array of multipoles 66. In another example, a potential of the proxi-electrode 70 may be substantially equal with a mean potential of at least one of a first array of multipoles 62, a second array of multipoles 64, and a third array of multipoles 66.

In further embodiments, a potential of the proxi-electrode 70 may be substantially equal with a potential of the specimen 90 or with a surface potential of the specimen 90. In yet further embodiments, a potential of at least one of the first array of multipoles 62, the second array of multipoles 64, and the third array of multipoles 66 may be substantially equal with a potential of the plurality of charged particle beamlets 16.

Beneficially, when the potential are the same or substantially the same, e.g. between the proxi-electrode 70 and the charged particle beamlets 16, lenslet effects can be avoided or produced to a specified magnitude.

The phrase 'substantially equal' may be understood as equal, within +/−20% or within +/−10%. For example, a potential of the proxi-electrode 70 may be substantially equal with a potential of the plurality of charged particle beamlets 16 may be understood as the potential of the proxi-electrode 70 is equal with the potential of the plurality of the charged particle beamlets 16, is within +/−20% of the potential of the plurality of the charged particle beamlets 16, or is within +/−10% of the potential of the plurality of the charged particle beamlets 16.

In an embodiment, the proxi-electrode 70 may be a macro electrode, or an electrode having one aperture for (all of) the charged particle beamlets 16.

FIG. 1 exemplarily shows charged particle beamlets 16. An axis of a first charged particle beamlet 16a may be substantially coincident with a main optical axis of a lens. The lens may be an objective lens 46 as shown in FIG. 1. The lens may have a magnetic lens component. The magnetic lens component may include pole pieces for focusing of charged particles 16, particularly at the gap between the pole pieces. That is, the magnetic lens component may be configured to generate a focusing action. The magnetic lens component may define a main optical axis of the lens. A first charged particle beamlet 16a travelling along the main optical axis may be influenced, e.g. collimated or focused, by the magnetic lens component. Off-axis beamlet(s) travelling at a distance to the main optical axis, e.g. parallel or at an angle, to the main optical axis may be influence, e.g. collimated or focused, by the lens as well.

Yet further, off-axis beamlet(s) travelling at a distance, e.g. parallel or at an angle, to the main optical axis may be in a deflection field or dipole field of the lens as a result of travelling at a distance to a main optical axis of a lens. The deflection field would be mainly directed towards the main optical axis, but may also include a Larmor rotation. According to embodiments, an array of dipole field generating elements may be provided to compensate for the deflection field on off-axis beamlets by the lens. In some embodiments, multipoles may be arranged to coincide with a spiral propagation path of respective charge particle beamlets.

An array of multipoles, e.g. a first array of multipoles 62 in the example of FIG. 1, may be configured to guide charged particle beamlets 16. The multipole may compensate for a lens deflection force on the beamlet by a lens. Accordingly, a beamlet that is propagating through a lens and a multipole may be influenced by said lens, e.g. focused or collimated, without being deflected by said lens. For example, a respective beamlet propagating essentially parallel, along or at an angle to an optical axis of a respective multipole that is within or proximate to a lens, is guided to propagate essentially parallel, along or at an angle, respectively, to said optical axis of said respective multipole, by said multipole. Each multipole of an array of multipoles 60 may guide a respective beamlet of a plurality of beamlets 16.

According to embodiments, each multipole of the first array of multipoles 62 may provide a respective field strength for deflecting the respective charged particle beamlet. The respective field strength may be proportional to the distance between the respective multipole and the main optical axis of the lens. Accordingly, a multipole may deflect a respective charged particle beamlet to compensate for a lens deflection force on the respective charged particle beamlet. Thus, a respective charged particle beamlet may be guided essentially parallel, along, or at an angle to a respective optical axis of a respective multipole. A respective charged particle beamlet may be a charged particle beamlet that is off-axis with respect to the main optical axis.

As shown in FIG. 1, two or more arrays of multipoles, for example, a first array of multipoles 62 and a second array of multipoles 64, may be provided. For example, the arrays of multipoles may be arranged along the axes of the charged particle beamlets 16. Alternatively, or additionally, the arrays of multipoles may be arranged along the main axis of the charged particle beam device. Alternatively, or additionally, the arrays of multipoles may be arranged along the main optical axis of the lens.

In an embodiment which can be combined with other embodiments, a multipole of an array of multipoles may be arranged off-axis with respect to a respective charged particle beamlet. For example, a multipole may be arranged with the optical axis of the multipole offset with respect to the axis of the respective charged particle beamlet. The amount and direction of offset may, at least partially, compensate for (first order) lens aberration, e.g. axial coma, axial astigmatism. Additionally, second or third order correction may also be provided in the same multipole.

In an example, each multipole that are off-axis with respect to the optical axis of the lens, e.g. each non-central multipole or non-axial multipole, may be arranged with the optical axis of the respective multipole (at an) offset with respect to the axis of the respective charged particle beamlet. In an example, the optical axis of a multipole is arranged (at an) offset, at a (non-zero) distance, and parallel to the axis of the respective charged particle beamlet. Accordingly, the multipole offset with respect to the charged particle beamlet may, at least partially, compensate for (first order) lens aberration. Thus, the guiding of the charge particle beamlets 16 can include first order correction and possibly second correction and third order corrections as well.

A first array of multipoles 62 is provided. A second array of multipoles 64, and/or a third array of multipoles 66 may be provided. Further, a proxi-electrode 70 may be provided in a charged particle beam device according to embodiments of the present disclosure. The second array of multipoles 64 may be arranged at a different position along the main optical axis of the lens than the first array of multipoles 62. Alternatively, any number of arrays of multipoles may be provided.

Each of the second array of multipoles 64 and further array(s) of multipoles 66 may be according to any embodiment of the first array of multipoles 62. For example, at least one multipole of the first array of multipoles 62 may a dipole, quadrupole, or octupole device. Accordingly, at least one multipole of the second array of multipoles 64 may also be a dipole, quadrupole or octupole device. For conciseness, further embodiments of the first array of multipoles are applicable to further array(s) of multipoles and shall not be repeated.

According to some embodiments, which can be combined with other embodiments described herein, each multipole of an array of multipoles 60 may be configured to guide, possibly in combination with a respective multipole of another array of multipoles, a respective charged particle beamlet 16 essentially along the direction at which said respective charged particle beamlet enters the lens, e.g. continue to propagate parallel, along, or at an angle to a main optical axis of said lens.

Alternatively, in the beneficial case of local compensation, each multipole of an array of multipoles 60 may be configured to guide, possibly in combination with a respective multipole of another array of multipoles, a respective charged particle beamlet 16 essentially along the direction at which said respective charged particle beamlet enters said multipole, e.g. continue to propagate parallel, along, or at an angle to a optical axis of said respective multipole.

For example, each multipole of the first array of multipoles 62 and second array of multipoles 64 may be beneficially configured to compensate for a local lens deflection force of a respective charged particle beamlet 16. The lens deflection force may be towards the main optical axis of the lens. The lens deflection force may be produced by the lens. A local lens deflection force may be understood as a portion or fraction of the total lens deflection force on a respective charged particle beamlet 16 towards the main optical axis of a lens produced by the lens on said respective charged particle beamlet 16 propagating through said lens.

Accordingly, a first array of multipoles 62 and possibly a second array of multipoles 64 may be configured to compensate, at least partially, for a deflection of a beamlet by a lens.

Each multipole of the first array of multipoles 62 and second array of multipoles 64 may be beneficially configured to deflect a respective charged particle beamlet 16 by a deflection amount that is smaller than a deflection amount by either the first array of multipoles 62 or second array of multipoles 64 individually. Thus, the lens deflection force on the charged particle beamlet 16 by a lens may be (fully) compensated by a plurality of arrays of multipoles in combination.

According to some embodiments, the phrase, essentially parallel, along or at an angle to a direction may be defined as the propagation direction of the charged particle beamlet being at an angle with said direction of less than 50 mrads, less than 30 mrads, less than 15 mrads, less than 10 mrads, or less than 5 mrads. The unit mrads has a meaning of milliradians. A direction may be a propagation direction of a beamlet, a direction of a main optical axis of a lens or a direction of an optical axis of a multipole.

As shown in FIG. 2, there may be a plurality of multipoles in the first array of multipoles 62. Each multipole of the first array of multipoles 62 may be a quadrupole device. The first multipole 62a of the first array of multipoles 62 (in dotted line), is optionally provided.

The first multipole 62a may be described as a central and/or axial multipole. The first multipole 62a may be arranged along the main optical axis of the lens.

Alternatively, the first multipole 62a may not be provided. For example, an array of multipoles 60, e.g. the first array of multipoles 62, may include a plurality of multipoles except in a position along the main optical axis of the lens.

In some embodiments, there is no deflection of the charged particle beamlet towards the main optical axis of the lens produced by the lens at one of the multipoles, for example at the first multipole 62a, arranged along the main optical axis of the lens.

A position along the main optical axis of the lens maybe described as a central and/or axial position, or a multipole at a central and/or axial position. A multipole at a position along the main optical axis of the lens may be described as a central and/or axial position, or a multipole at a central and/or axial position.

A radial distance may be understood as a distance from a main optical axis of a lens. There may be a first multipole 62a, which may be described as an axial or central multipole, with a zero radial distance, e.g. with respect to the main optical axis. Accordingly, a first multipole 62a may be arranged along the main optical axis of the lens.

Figure 4:
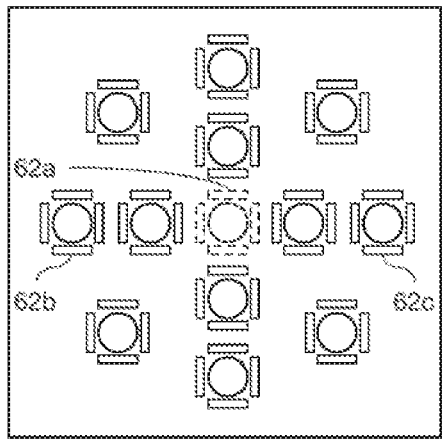
FIG. 4 is a schematic drawing illustrating an arrangement of an array of multipoles of a charged particle beam manipulation device according to embodiments described herein.

As shown in FIG. 4, the multipoles of an array of multipoles 60 may be arranged in an annular or circumferential arrangement. For example, at least one, beneficially a plurality of multipoles of a first array of multipoles may be arranged on a first circle with a first radius from a centre of the first array of multipoles. Optionally, a further at least one, beneficially a further plurality of multipoles of the first array of multipoles may be arranged on a second circle with a second radius from the centre of the first array of multipoles. A central or axial multipole may optionally be provided in the first array of multipoles. Accordingly, multipoles of a first array of multipoles 60 may be arranged in an annular or circumferential arrangement. Such an arrangement has the advantage of a simpler design for some optical aberration corrections such as field curvature correction. Such an arrangement has the further advantage of a simpler control, in particular for compensating for lens deflection force and/or correcting aberration of the lens since lens deflection force and/or lens aberration may have a corresponding pattern, e.g. annularly uniform.

Figure 5:
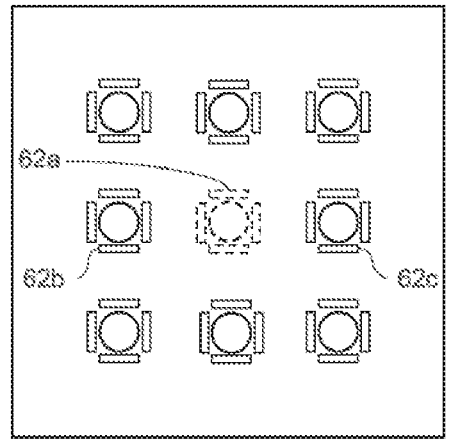
FIG. 5 is a schematic drawing illustrating an arrangement of an array of multipoles of a charged particle beam manipulation device according to embodiments described herein.

As shown in FIG. 5, the multipoles of the an array of multipoles 60, e.g. first array of multipoles 62, may be arranged in a linear arrangement or grid arrangement. For example, the multipoles may be arranged in rows and columns. Accordingly, multipole control, e.g. for scanning, may be simpler since, for example, overlap or pitch (spacing) between beamlets may be consistent or constant. Such an arrangement has the further advantage that high density of multipoles can be arranged on the array of multipoles, thus improving throughput.

In some embodiments, the multipoles of an array of multipoles 60, e.g. first array of multipoles 62, may be arranged in a hexagonal or honeycomb arrangement. Such an arrangement has the advantage of reducing or minimising optical crosstalk, thus improving throughput.

The multipoles of an array of multipoles 60, e.g. first array of multipoles 62, may include a shield assembly having a shielding element at least partially surrounding each multipole. deflector. The shield assembly may be configured to reduce cross-talk. Cross-talk may be from a multipole to adjacent/neighbouring beamlets. For example, cross-talk may be from a first multipole for a first beamlet to a second beamlet. Accordingly, a multipole may have reduced influence or substantially reduced influence, for example reduced by 4 orders of magnitude, on another beamlet or adjacent/neighbouring beamlets, or on the manipulation/deflection of another beamlet/neighbouring beamlet.

According to embodiments, a multipole of an array of multipoles 60 may be configured to correct for an aberration of the lens on the respective charged particle beamlet. A first multipole 62a may be arranged along a main optical axis of a lens, for example along a main optical axis of an objective lens 46a, within the lens, for example within the objective lens 46.

A multipole may be configured to correct for aberration(s) of a respective charged particle beamlet 16. The aberration may be caused the lens. A central or axial multipole may correct for an aberration of the lens but not compensate for a lens deflection force on the respective charged particle beamlet 16. A multipole in general, for example may be configured to correct for an aberration of the lens and compensate for a lens deflection force on the respective charged particle beamlet 16.

Figure 6A:
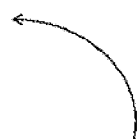
FIG. 6A is a schematic drawing illustrating a view from above of a curved electron path due to a rotation in the magnetic field.

FIG. 6A shows an example of an electron path, as seen from above. The electron path may be curved due to a rotation in the magnetic field of a lens. According to embodiments, a wafer having a multipole array may be empty of material except for the multipoles, control lines for said multipoles and mechanical support elements. According to embodiments, a wafer having a multipole array may have hole(s) having a semi-annular shape for passage of secondary charged particles.

Figure 6B:
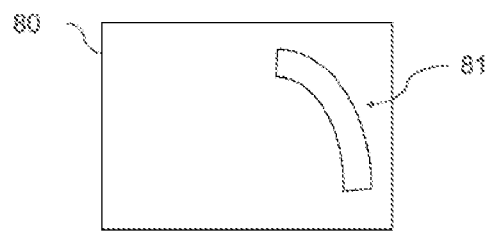
FIG. 6B is a schematic drawing illustrating a wafer for a multipole array having a semi-annular shaped hole for secondary charged particles according to embodiments described herein.

FIG. 6B shows an embodiment of a wafer for an array of multipoles. The wafer 80 for an array of multipoles may include a semi-annular shaped hole 81 for secondary charged particles to pass through. Hole(s) having a semi-annular shape, e.g. curved slit, has an advantage of being easy to align. Semi-annular shaped hole(s) may be the same in each wafer layer. Semi-annular shaped hole(s) may be arranged in each wafer layer with an offset. Each wafer layer may have a single multipole array. Accordingly, multipole array(s) may be configured to allow secondary charged particles may passed through said multipole array(s).

Figure 6C:
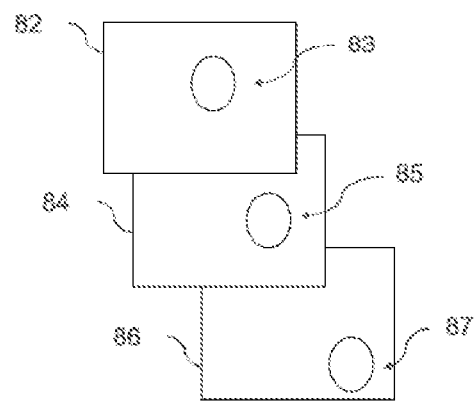
FIG. 6C is a schematic drawing illustrating a plurality of wafers, each for a respective multipole array, and with a symmetrical hole for secondary charged particles according to embodiments described herein.

FIG. 6C shows an embodiment of a plurality of wafers, each wafer for a respective array of multipoles. The first wafer 82 may include a first symmetrically shaped hole 83, e.g. circular, for secondary charged particles to pass through. The second wafer 84 may include a second symmetrically shaped hole 85, e.g. circular, for secondary charged particles to pass through. The third wafer 86 may include a third symmetrically shaped hole 87, e.g. circular, for secondary charged particles to pass through.

The plurality of wafers may be arranged parallel to each other. The plurality of wafers may be arranged consecutively or in a series along the optical axis of the objective lens 46a. Each of the plurality of wafers may be for supporting an array of multipoles.

The respective symmetrically shaped hole holes on each of the plurality of wafers may be arranged to allow secondary charged particles having a curved path (e.g. due to a rotation in the magnetic field of a lens) to pass through. For example, a respective symmetrically shaped hole on each of the plurality of wafers may have positions (in 3 dimension) that correspond to a path of secondary charged particles.

Accordingly, a wafer may include an array of multipoles and hole(s) of a symmetrical shape, e.g. circular. Each hole may be arranged to coincide with propagation path(s) of secondary charged particles. Each hole may thus be configured to allow secondary charged particles to pass through a respective multipole array.

In addition, each wafer described herein may include more than one hole for secondary charged particles.

According to embodiments, a wafer may have a plurality of layers, each having a respective multipole array, and each having hole(s), e.g. of a semi-annular shape and/or symmetrical shape. The hole(s) may be arranged to coincide with spiral-shaped propagation of secondary charged particles. Accordingly, a wafer according to the above embodiments allow(s) passage of secondary charged particles through said wafer.

According to embodiments, each multipole of an array of multipoles 60 may be an electrostatic multipole. Electrostatic multipoles provide stronger deflection than for example magnetic multipoles, particularly for array of micro-multipoles on wafer, for example using microelectromechanical systems (MEMS) processes. Accordingly, electrostatic multipoles can beneficially be provided as micro-multipoles. A single wafer may be provided with a plurality of layers. A plurality of arrays of multipoles may be on a single wafer. Each layer of a wafer may include an array of multipoles. Each layer may be less than 1 mm thick, beneficially on the order of hundreds of micrometres, more beneficially on the order or tens of micrometres, and even more beneficially on the order of micrometres. Accordingly, multipole density is increased and throughput improved. Such multipoles may work with a common (shared) lens to provide a high density of beamlets, e.g. per unit area, for improved throughput.

Electrostatic multipoles can also be more compact, than other types of multipoles. Electrostatic multipoles can overlap or work in combination with a magnetic field, for example, by the electrostatic multipoles being formed of non-magnetic material.

Electrostatic multipoles can be switched very quickly, e.g. at frequencies in the GHz range. Electrostatic multipoles can be configured as a round lens, for example by having 8 poles and exciting all 8 poles simultaneously. In another example, a multipole can be configured as a round lens by including a first quadrupole and a second quadrupole, arranged for example in the z-direction or along an optical axis of the objective lens, and configured to provide a positive stigmatism, and a negative stigmatism respectively or vice versa.

Electrostatic multipoles have the advantage of not requiring cooling. Electrostatic multipoles are also compact.

A quadrupole lens may be made of a first multipole with a positive astigmatism and a second multipole with a negative astigmatism.

Multipoles of a multipole array according to embodiments described herein may be fabricated with microelectromechanical system (MEMS) components. For example, the starting material for electrodes may be a thin double side polished 4" silicon wafer, that is subsequently covered with a silicon dioxide layer by thermal oxidation. The pattern of the lens holes may be defined by optical lithography and this pattern may be then transferred to the oxide layer by reactive ion etching.

Then the lens holes may be etched through the electrode using the oxide as an etch mask, for example, in a Bosch DRIE process. After etching, the electrodes may be cleaned using a combination of wet and dry processes and coated by sputter deposition. Accordingly, microelectromechanical system (MEMS) technology elements may be advantageous because they allow for higher multipole densities and simplify electrodes wiring.

Alternatively, an array of multipoles 60, for example the first array of multipoles 62, may be magnetic or combined electrostatic-magnetic multipoles. Magnetic multipoles have the benefit of lower dispersion, e.g. half, or less aberrations, than for example electrostatic multipoles. Alternatively, at least one multipole of the at least one array of multipoles 60 may be an electrostatic multipole and at least one other multipole of the at least one array of multipoles 60 may be a magnetic multipole or magnetic-electrostatic multipole.

In an embodiment, a combined electrostatic-magnetic multipole may be provided by a Wien filter. Such a multipole has the benefit of having minimal or no dispersion. The combined electrostatic-magnetic multipole may also be configured as an energy filter.

According to embodiments, each multipole of the first array of multipoles 62 may have at least two poles or be configured to generate an n-pole field where n is at least 2, beneficially at least 4. In an example the multipole is an electrostatic multipole, the first electrode of the multipole may be set on a first electric potential, and a second electrode of the multipole may be set on a second electric potential, so that an electric dipole field acts in a region between the multipole electrodes for deflecting a respective charged particle beamlet.

However, beam aberrations, for example, an astigmatism of the charged particle beamlet 16, or higher order beam distortions may be corrected with higher order multipole correctors, for example, with a quadrupole device or with an octupole device. The performance and accuracy of a multipole corrector may be increased by increasing the number of electrodes. For example, undesired decapole components of the fields may be avoided, by providing a large number of poles (N≥10).

A first multipole 62a, e.g. the central multipole, of an array of multipoles 60, e.g. of the first array of multipoles 62, may optionally be provided, and if so, may be arranged on a main optical axis of the lens. At least one further multipole, e.g. second multipole 62b, third multipole 62c, of the array of multipoles 60, e.g. of the first array of multipoles 62, may be arranged at a distance to a main optical axis of the lens, for example arranged parallel to the main optical axis of the lens. Each multipole of an array of multipoles 60, e.g. first array of multipoles 62, may be arranged to act on or manipulate, respective charged particle beamlets 16. The respective charged particle beamlets may be generated or emitted from a (single) charged particle source 10.

A first multipole 62a of an array of multipoles 60, e.g. of the first array of multipoles 62, may be configured to correct only higher order aberrations as described in embodiments herein. At least one further multipole, e.g. second multipole 62b, third multipole 62c, may be configured to correct for higher order aberrations and for compensating a lens deflection force on respective charged particle beamlets 16. The lens deflection force may be towards a main optical axis of a lens. The at least one further multipole may be configured to correct for a Larmor rotation of respective charged particle beamlet(s) 16 as described in embodiments herein.

In an advantageous embodiment, one or more multipoles of an array of multipoles 60, e.g. of the first array of multipoles 62, may be an electrostatic multipole, and may be an octopole, that is, may include eight electrodes. For example, each multipole of an array of multipoles 60, e.g. of the first array of multipoles 62, may be an electrostatic multipole, and may be an octopole, that is, may include eight electrodes.

Each multipole of the first array of multipoles 62, and optionally further array(s) of multipoles, e.g. second array of multipoles 64, third array of multipoles 66, may be in a plane that is substantially perpendicular or in a plane that is perpendicular to a main optical axis of a lens. Accordingly, a pseudo on-axis action can be provided, even when the lens is off-axis with respect to at least one beamlet, e.g. second charged particle beamlet 16b and third charged particle beamlet 16c.

At least one array of multipoles 60 may be provided, e.g. a first array of multipoles 62. Optionally further array(s) of multipoles, e.g. second array of multipoles 64 and third array of multipoles 66, may also be provided. The at least one array of multipoles 60 may include at least two multipoles, e.g. a first multipole 62a, a second multipole 62b, a third multipole 62c. The multipoles may be for respective charged particle beamlets, e.g. first charged particle beamlet 16a, second charged particle beamlet 16b, third charged particle beamlet 16c.

The at least one array of multipoles 60 may include a plate having apertures formed therein. Electrodes associated with each aperture may be formed. The electrodes may be configured to receive electrical signals for deflecting a respective charged particle beamlet passing through the respective aperture.

Upon the supply of an electric signal towards a multipole element, a deflection field or deflection action, which may be electric and/or magnetic, is established over a corresponding aperture. The deflection field or deflection action can provide a deflection force or action on the charged particle beam passing through said aperture of the multipole.

The at least one array of multipoles 60 may include control lines. The control lines may extend as vertical and horizontal conducting bus lines (not shown). The control lines may be formed on the surface of a plate of the at least one array of multipoles 60. The control lines may be formed using lithography and etching techniques. Individual control lines for each multipole electrode may be provided (not shown).

Each multipole in the array can be addressed by applying electrical signals to a bus lines for the corresponding row and column, using a bit-line and word-line addressing method as used in DRAM or other semiconductor memory technologies. The signal thus provided for each multipole will control deflection of the charged particle beamlet passing through the aperture of the respective multipole.

In an alternative embodiment, the multipoles may be controlled using optical switches and/or a CMOS-MEMS blanker array, such as those described in U.S. Pat. No. 8,242,467B2.

According to some embodiments, a gap/bore and/or orientation of each multipole of an array of multipoles may be configured for providing the compensation. A first multipole of an array of multipoles may be configured with a first gap length or a first bore diameter or first orientation (with respect to a respective or first charged particle beamlet) to compensate for a first lens deflection force on a respective or first charged particle beamlet. A second multipole of an array of multipoles may be configured with a second gap length or second bore diameter or second orientation (with respect to a respective or second charged particle beamlet) to compensate for a second lens deflection force on a respective or second charged particle beamlet.

The first charged particle beamlet and second charged particle beamlet may be beamlets that are off-axis with respect to a main optical axis of the lens. The first and second deflection force may be produced by said lens. The first gap length or first bore size or first orientation (with respect to a respective or first charged particle beamlet) and second gap length or second bore size or second orientation (with respect to a respective or second charged particle beamlet) may be different. Accordingly, a first multipole and a second multipole may be controlled with a single control element.

A control element may be control signal(s) to control both a first multipole and a second multipole. For example, a control element may be a first pair of voltage signals. A first pair of voltage signals may be for controlling a first (electrostatic) multipole having a first gap length or first bore diameter or first orientation (with respect to a respective or first charged particle beamlet), and also for controlling a second (electrostatic) multipole having a second gap length or second bore diameter or second orientation (with respect to a respective or second charged particle beamlet).

Alternatively, a control element may be resistors or a first resistor network to control both a first multipole and a second multipole. For example, a control element may be a first pair of resistors or a first resistor network. A first pair of resistors or a first resistor network may be for controlling a first (electrostatic) multipole having a first gap length or first bore diameter or first orientation (with respect to a respective or first charged particle beamlet), and also for controlling a second (electrostatic) multipole having a second gap length or second bore diameter or second orientation (with respect to a respective or second charged particle beamlet).

In some embodiments, a plurality of multipoles, for example more than two multipoles of an array of multipoles or all of the multipoles of an array of multipoles or a plurality of multipoles including at least one multipole of a first multipole array and at least one multipole of a second multipole array or all multipoles of a plurality of arrays of multipoles, may be configured with respective gap lengths or respective bore diameters or respective orientations to compensate for respective lens deflection forces on respective charged particle beamlets.

Said more than two multipoles of an array of multipoles or all of the multipoles of an array of multipoles or a plurality of multipoles including at least one multipole of a first multipole array and at least one multipole of a second multipole array or all multipoles of a plurality of arrays of multipoles may be controlled with a single control element. A single control element may be understood as including a plurality of sub-elements, e.g. voltage signals or resistors, configured to cause a multipole to generate a single or specific field configuration.

Accordingly, the number of control lines to the multipoles may be minimised or reduced, and density of multipoles increased for improved throughput. Further, control may be simplified.

Due to a field of the lens, there may be a change of a rotation angle of the charged particle beamlet(s), e.g. second charged particle beamlet $16b$, third charged particle beamlet $16c$, for example at the specimen 90, about the first charged particle beamlet $16a$ or about the main optical axis of the lens. This change of the rotation angle of the charged particle beamlet(s), e.g. second charged particle beamlet $16b$, third charged particle beamlet $16c$, may be a Larmor rotation of the charged particle beamlets 16 caused by a field of the lens. The field of the lens may be a magnetic and magnetic-electrostatic field of the lens.

FIG. 3 shows a charged particle beam device according to embodiments described herein. According to embodiments, a charged particle beam device may be for a plurality of charged particle beamlets e.g. suitable for a multi-beam type system. The charged particle beam device is advantageously a multibeam and single column (or single source) type device.

According to embodiments, a charged particle beam device may include a charged particle source 10 configured for emitting a (single) primary charged particle beam 12.

An aperture plate 20 may be arranged downstream of a charged particle source 10. The aperture plate 20 may have a plurality of apertures, e.g. three apertures, to produce a plurality of charged particle beams or beamlets. The aperture plate 20 may be configured to split the charged particle beam 12 from the charged particle source 10 to generate a plurality of uncollimated charged particle beamlets 14. The aperture plate may be arranged to be (immediately/directly) upstream of an array of collimating deflectors 30.

An array of collimating deflectors 30 may be arranged downstream of the aperture plate 20, for example directly or immediately downstream of the aperture plate 20. The array of collimating deflectors 30 may be configured to influence or act on the uncollimated charged particle beamlets 14 such that the charged particle beamlets appear as beamlets from different sources, for example by deflecting or collimating the uncollimated charged particle beamlets 14. According, a plurality of (collimated) charged particle beamlets 16 may be produced, for example in combination with a single charged particle source 10 and an aperture plate 20.

According to an embodiment which can be combined with other embodiments described herein, the charged particle beam device may be a single source and single column type system. According to embodiments, the charged particle device may include a charged particle manipulation device according to embodiments described herein. Thus, the charged particle beam manipulation device may be for a single source and single column type charged particle beam system.

A Larmor rotation of the charged particle beamlets 16 may be compensated for by a coil (not shown), such as a long solenoid coil, having a high aspect ratio (i.e., the coil is longer along its axial dimension than along its radial dimension). The coil can be inserted into a (drift) space between an arrangement generating the charged particle beamlets (for example the charged particle source 10, aperture plate 20, and array of collimating deflectors 30) and the lens.

In an alternative embodiment, a rotation-free magnetic electron lens doublet may be used. In this case, there would be no need to compensate for a Larmor rotation.

A coil with high aspect ratio (not shown), e.g. arranged in a drift space, may provide a defined amount of Larmor rotation. Accordingly, original focusing properties of the charged particle beamlets 16 may remain (substantially) unchanged. Beneficially, a coil with high aspect ratio may produce marginal additional focusing action, for example when Larmor rotation angles are small, e.g. below +/−30°. Accordingly, deterioration of original optical properties at zero coil excitation is small.

Larmor rotation compensation means can be advantageously provided upstream of the objective lens. Provision of Larmor rotation compensation can avoid mechanical rotation of the at least one multipole array.

A single column charged particle device may have a common (shared) objective lens for the plurality of charged particle beamlets. The objective lens may have at least a first array of multipoles 62 according to embodiments described herein.

Accordingly, the usable area of the lens, e.g. objective lens, can be increased, so that more beamlets per area of lens can be provided, thus throughput can be increased. Further, lens deflection force compensation and advantageously aberration correction can be provided by the same multipole, thus throughput improved. According to embodiments, at least one compensating lens or at least two compensating lenses can be provided in addition to or in place of a multipole of an array of multipoles. Accordingly, a compensating lens may improve the characteristics of a charged particle beamlet that is off-axis with respect to a (common) lens and electron-electron interactions can be reduced and throughput improved. A compensating lens may compensate for a lens deflection force as follows.

A compensating lens may be arranged off-axis in a first direction with respect to a respective charged particle beamlet. The respective charged particle beamlet may be off-axis in a second direction with respect to the (common) lens. The (common) lens may be for a plurality of charged particle beamlets. The first direction may be the opposite direction to the second direction. Accordingly, the compensating lens may compensate, at least partially, for the lens deflection force on the respective charged particle beamlet (by the lens or common lens).

In some embodiments, the compensating lenses are electrostatic lenses. In some embodiments, the compensating lenses are smaller than the (common) lens. By arranging a compensating lens deliberately off-axis with respect to the respective charged particle beamlet that is propagating off-axis with respect to the (common) lens, the lens deflection force of the (common) lens may be compensated. Accordingly, a compensating lens and a (common) lens may be arranged to have opposite dipole moments.

A plurality of compensating lenses may be provided. For example, at least ten compensating lenses. Each of the plurality of compensating lenses may be arranged off-axis in the first direction. Each of the plurality of compensating lenses may act on the same charged particle beamlet.

In embodiments where one compensating lens for a respective charged particle beamlet is provided, there may be provided an array of compensating lenses for a plurality of charged particle beamlets respectively.

In embodiments where a plurality of compensating lenses, each for the same charged particle beamlet, is provided, there may be provided a plurality of arrays of compensating lenses. Each compensating lens of an array of compensating lenses may be for a respective charged particle beamlet.

A compensating lens may have a diameter smaller than the (common) lens. For example, a compensating lens may have a diameter at least half the diameter of the (common) lens, preferably at least a tenth the diameter of the (common) lens.

In some embodiments described herein, the compensating lens that is smaller than the (common) lens can have a larger spherical aberration coefficient than the (common) lens. However, the improvement in current density of a charged particle beamlet according provided by the embodiments of compensating lens for a plurality of beamlets (multi-beam system) described herein is greater than the negative effect of the worse spherical aberration coefficient, and is particularly beneficial for multi-beam systems e.g. plurality of charged particle beamlets. Thus, throughput is improved.

Figure 7:
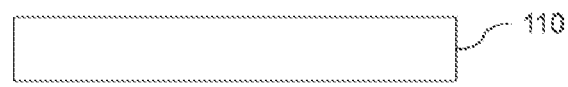
FIG. 7 is a method for manipulating charged particle beams according to embodiments described herein.
Figure 7:
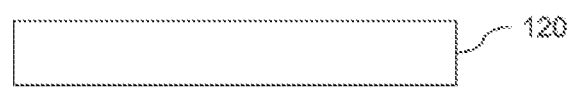

Further embodiments relate to a method for manipulating charged particle beams or beamlets in a multi-beam system. FIG. 7 shows a method of manipulating charged particle beams or beamlets according to embodiments described herein.

As shown in FIG. 7, the method for manipulating charged particle beams or beamlets includes influencing, using a lens having a main optical axis, the charged particle beamlets at or onto respective positions on a specimen 110.

The method may include influencing 110, using a lens having a main optical axis, charged particle beamlets. The method may include compensating 120, using a respective multipole of a first array of multipoles comprised within the lens, for a lens deflection force on a respective charged particle beamlet of the plurality of charged particle beamlets. The lens deflection force is a deflection force produced by the lens on the respective charged particle beamlet towards the main optical axis of the lens.

The method may include compensating 120 for a lens deflection force of a respective charged particle beamlet towards the main optical axis of the lens produced by the lens using a respective multipole of a first array of multipoles comprised within the lens.

The lens may be an objective lens or a condenser lens. Influencing 110 may include focusing the charged particle beamlets at or onto respective positions on a specimen. Influencing 110 may include collimating the charged particle beamlets.

Compensating 120 may include guiding the respective charged particle beamlet to propagate essentially parallel to a first direction. The first direction is the respective charged particle beamlet propagation direction as the respective charged particle beamlet enters a deflection field of the lens. Guiding may include generating, using the respective multipole, a first multipole deflection force on the respective charged particle beamlet to cause the respective charged particle beamlet to propagate essentially parallel to a first direction for guiding the respective charged particle beamlet.

Compensating 120 for the lens deflection force may include generating, using a respective multipole of a second array of multipoles, a second multipole deflection force on the respective charged particle beamlet to cause, in combination with generating the first multipole deflection force, the respective charged particle beamlet to propagate essentially parallel to the first direction.

According to some embodiments, compensating a respective lens deflection force may include guiding a respective charged particle beamlet (essentially) along, parallel to, or at an angle to a respective optical axis of the respective multipole of the first array of multipoles.

According to some embodiments, compensating a respective lens deflection force may include providing a respective field strength that is proportional to a distance between the respective multipole and the main optical axis of the lens.

According to some embodiments, compensating for the respective lens deflection force may include guiding the charged particle beamlets with the first array of multipoles and a second array of multipoles (essentially) along, parallel to, or at an angle to respective optical axes.

The invention claimed is:

1. A method for manipulating charged particle beamlets from a single charged particle source, the method comprising:
    influencing, using a lens having a main optical axis, the charged particle beamlets from the single charged particle source, and
    compensating, using a respective multipole of a first array of multipoles comprised within the lens, for a lens deflection force on a respective charged particle beamlet of the plurality of charged particle beamlets, wherein the lens is arranged to act on the plurality of charged particle beamlets, and wherein the first array of multipoles is as an array of micro-multipoles on a wafer formed using a microelectromechanical (MEMS) process,
    the lens deflection force being a deflection force produced by the lens on the respective charged particle beamlet towards the main optical axis of the lens.

2. The method for manipulating charged particle beamlets according to claim 1,
    wherein the lens is an objective lens or a condenser lens, and/or
    wherein influencing comprises focusing the charged particle beamlets onto respective positions on a specimen or collimating the charged particle beamlets.

3. The method for manipulating charged particle beamlets according to claim 1, wherein
    compensating comprises guiding the respective charged particle beamlet to propagate essentially parallel to a first direction, wherein the first direction is the respective charged particle beamlet propagation direction as the respective charged particle beamlet enters a deflection field of the lens, and/or
    wherein guiding comprises generating, using the respective multipole, a first multipole deflection force on the respective charged particle beamlet to cause the respective charged particle beamlet to propagate essentially parallel to the first direction for guiding the respective charged particle beamlet.

4. The method for manipulating charged particle beamlets according to claim 1, wherein compensating for the lens deflection force comprises generating, using a respective multipole of a second array of multipoles, a second multipole deflection force on the respective charged particle beamlet to cause, in combination with generating the first multipole deflection force, the respective charged particle beamlet to propagate essentially parallel to the first direction.

5. A charged particle beam manipulation device for a plurality of charged particle beamlets from a single charged particle source, the charged particle beam manipulation device comprising:
a lens having a coil surrounding a main optical axis, wherein the lens is an objective lens or a condenser lens,
the coil having an opening for the charged particle beamlets,
the lens comprising a first array of multipoles, the first array of multipoles comprising micro-multipoles on a wafer;
each multipole of the first array of multipoles configured to compensate for a lens deflection force on a respective charged particle beamlet of the plurality of charged particle beamlets from the single charged particle source, wherein the lens is arranged to act on the plurality of charged particle beamlets,
the lens deflection force being a deflection force produced by the lens on the respective charged particle beamlet towards the main optical axis of the lens.

6. A charged particle beam manipulation device for a plurality of charged particle beamlets from a single charged particle source, the charged particle beam manipulation device comprising:
a lens having a main optical axis, wherein the lens is an objective lens or a condenser lens,
the lens comprising at least a first array of multipoles, the first array of multipoles comprising micro-multipoles on a wafer,
each multipole of the first array of multipoles configured to compensate for a lens deflection force on a respective charged particle beamlet of the plurality of charged particle beamlets from the single charged particle source, wherein the lens is arranged to act on the plurality of charged particle beamlets,
the lens deflection force being a deflection force produced by the lens on the respective charged particle beamlet towards the main optical axis of the lens.

7. The charged particle beam manipulation device according to claim 6,
wherein the lens is configured to focus the charged particle beamlets onto respective positions on a specimen, or the lens is configured to collimate the plurality of charged particle beamlets.

8. The charged particle beam manipulation device according to claim 6, wherein each multipole of the first array of multipoles is further configured to correct for an aberration of the respective charged particle beamlet by the lens,
wherein each multipole of the first array of multipoles comprises at least four poles, and/or
wherein each multipole of the first array of multipoles is further configured to correct for an astigmatism of the lens.

9. The charged particle beam manipulation device according to claim 6,
wherein each multipole of the first array of multipoles is configured to provide a first multipole deflection force on the respective charged particle beamlet to cause the respective charged particle beamlet to propagate essentially parallel to a first direction for compensating for the lens deflection force, and
wherein the first direction is the respective charged particle beamlet propagation direction as the respective charged particle beamlet enters a deflection field of the lens.

10. The charged particle beam manipulation device according to claim 6,
further comprising a second array of multipoles arranged at a different position along the main optical axis of the lens from the first array of multipoles, and
optionally wherein each multipole of the second array of multipoles is configured to provide a second multipole deflection force for compensating, in combination with the first array of multipoles or the first multipole deflection force, for the lens deflection force on the respective charged particle beamlet.

11. The charged particle beam manipulation device according to claim 9, wherein essentially parallel to a first direction is defined as having an angle that is less than 30 milliradians, less than 15 milliradians or less than 5 milliradians, to the first direction.

12. The charged particle beam manipulation device according to claim 6, wherein each multipole is an electrostatic multipole and/or wherein the lens is a magnetic-electrostatic lens.

13. The charged particle beam manipulation device according to claim 6,
wherein a potential of a proxi-electrode is equal with a potential at a centre of each aperture of a respective array potential of at least one of the first array of multipoles, a second array of multipoles, and a third array of multipoles.

14. A charged particle beam device, comprising:
a charged particle source configured for emitting a charged particle beam,
an aperture plate configured for generating a plurality of charged particle beamlets from the charged particle beam, and
the charged particle beam manipulation device according to claim 6.

15. The charged particle beam device according to claim 14, wherein the charged particle beam device is a multi-beam, single column, and/or single source device.

* * * * *